(12) United States Patent
Kai

(10) Patent No.: US 11,160,181 B2
(45) Date of Patent: Oct. 26, 2021

(54) ADAPTER FOR INSERTION BOARDS

(71) Applicant: FANUC CORPORATION, Yamanashi (JP)

(72) Inventor: Yoshirou Kai, Yamanashi-ken (JP)

(73) Assignee: Fanuc Corporation

( * ) Notice: Subject to any disclaimer, the term of this patent is extended or adjusted under 35 U.S.C. 154(b) by 22 days.

(21) Appl. No.: 16/709,275

(22) Filed: Dec. 10, 2019

(65) Prior Publication Data

US 2020/0196473 A1    Jun. 18, 2020

(30) Foreign Application Priority Data

Dec. 12, 2018    (JP) .............................. JP2018-232428

(51) Int. Cl.
| H05K 5/02 | (2006.01) |
| H05K 1/14 | (2006.01) |
| H01R 12/70 | (2011.01) |

(52) U.S. Cl.
CPC ....... H05K 5/0282 (2013.01); H01R 12/7082 (2013.01); H05K 1/141 (2013.01); *H05K 2201/044* (2013.01); *H05K 2201/10189* (2013.01); *H05K 2201/2018* (2013.01)

(58) Field of Classification Search
CPC .......... G06F 1/185; G06F 1/16; G06F 13/409; G06F 2213/0026; G06F 3/162; H01R 12/91
See application file for complete search history.

(56) References Cited

U.S. PATENT DOCUMENTS

| 5,227,957 A | 7/1993 | Deters |
| 9,407,022 B1 * | 8/2016 | Wang .................... H01R 12/91 |
| 2009/0060221 A1 * | 3/2009 | Freels .................... G06F 3/162 |
| | | 381/82 |

FOREIGN PATENT DOCUMENTS

| CN | 205811227 U | 12/2016 |
| JP | H05011886 A | 1/1993 |
| JP | H11003137 A | 1/1999 |
| JP | 2004327588 A | 11/2004 |
| JP | 3128494 U | 12/2006 |
| JP | 2007180667 A | 7/2007 |
| JP | 2010026726 A | 2/2010 |

OTHER PUBLICATIONS

English Machine Translation for Japanese Publication No. 3128494 U, published Dec. 20, 2006, 8 pgs.
English Machine Translation for Japanese Publication No. 2007-180667 A, published Jul. 12, 2007, 10 pgs.
English Abstract and Machine Translation for Japanese Publication No. JPH05-011886A, published Jan. 22, 1993, 6 pgs.
English Abstract and Machine Translation for Japanese Publication No. JPH11-003137A, published Jan. 6, 1999, 6 pgs.

(Continued)

*Primary Examiner* — Jean F Duverne
(74) *Attorney, Agent, or Firm* — Fredrikson & Byron, P.A.

(57) ABSTRACT

An adapter for connecting a PCI board and a PCIe board to a control board installed in a slot of an electronic device, includes a base plate. The base plate includes a holding structure configured to selectively hold a PCI relay board and a PCIe relay board, and an attachment structure configured to selectively attach a PCI bracket and a PCIe bracket.

8 Claims, 3 Drawing Sheets

(56) References Cited

OTHER PUBLICATIONS

English Abstract and Machine Translation for Japanese Publication No. JP2004-327588A, published Nov. 18, 2004, 8 pgs.
English Abstract and Machine Translation for Japanese Publication No. JP2010-026726A, published Feb. 4, 2010, 20 pgs.
English Abstract and Machine Translation for Chinese Publication No. CN205811227U, published Dec. 14, 2016, 11 pgs.

* cited by examiner

ADAPTER FOR INSERTION BOARDS

CROSS-REFERENCE TO RELATED APPLICATION

This application is based upon and claims the benefit of priority from Japanese Patent Application No. 2018-232428 filed on Dec. 12, 2018, the contents of which are incorporated herein by reference.

BACKGROUND OF THE INVENTION

Field of the Invention

The present invention relates to an adapter.

Description of the Related Art

An insertion board with circuitry formed thereon can be connected to a control board of an electronic device by inserting an adapter with the insertion board mounted thereto, into a slot of the electronic device (Japanese Utility Model Registration No. 3128494). In this way, the insertion board can provide the electronic device with a predetermined function achieved by operation of a predetermined circuit. Here, some insertion boards to be inserted into the slots are designed based on a specific standard which specifies the shape and specifications for connection. One example of the typical standards is "Peripheral Component Interconnect" (PCI standard). Also, "Peripheral Component Interconnect-express" (PCIe standard) described in Japanese Utility Model Registration No. 3128494 is well known as a successor standard of the PCI standard.

SUMMARY OF THE INVENTION

In order to connect a PCI standard insertion board (which will hereinafter be referred to as PCI board) to the control board, a dedicated adapter for the PCI board is needed. Similarly, in order to connect a PCIe standard insertion board (which will hereinafter be referred to as PCIe board) to the control board, a dedicated adapter for the PCIe board must be prepared. In other words, each of the PCI board and the PCIe board can be attached only to the adapter that corresponds to its own standard.

It is therefore an object of the present invention to provide an adapter that facilitates selective attaching of a PCI board and a PCIe board thereto.

According to the present invention, an adapter configured to be inserted into a slot of an electronic device and also configured to connect each of a PCI (Peripheral Component Interconnect) board and a PCIe (Peripheral Component Interconnect-express) board to a control board that is installed on a side of the slot toward which the adapter is inserted, includes a base plate. The base plate includes: a holding structure configured to selectively hold a PCI relay board configured to connect the PCI board to the control board and a PCIe relay board configured to connect the PCIe board to the control board; and an attachment structure configured to selectively attach a PCI bracket configured to fix the PCI board to the base plate and a PCIe bracket configured to fix the PCIe board to the base plate.

The present invention can provide an adapter by which it is easy to selectively attach a PCI board and a PCIe board to the adapter.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

The adapter of the present invention will be described in detail below by giving preferred embodiments with reference to the accompanying drawings.

EMBODIMENT

Figure 1:
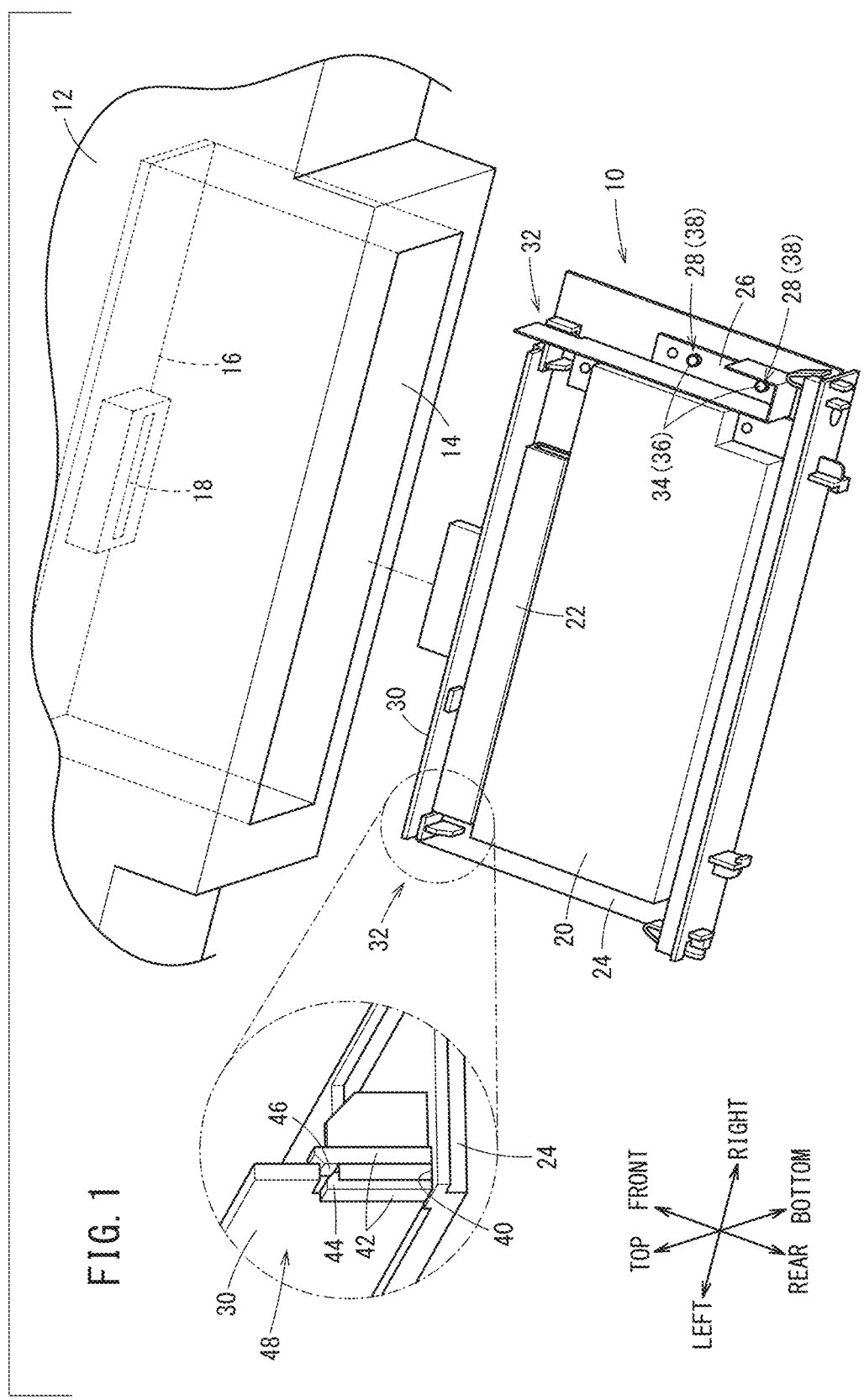
FIG. 1 is a perspective view of an adapter and an electronic device according to an embodiment.

FIG. 1 is a perspective view of an adapter 10 and an electronic device 12 according to the embodiment. Here, the directions described below correspond to the directions indicated by the arrows shown in FIG. 1.

The electronic device 12 has a slot 14. A control board 16 is arranged on a side (forward side) of the slot 14 toward which the adapter 10 is inserted. The control board 16 is provided with a slot-side connector 18 to be connected with the adapter 10. The connection specifications of the slot-side connector 18 may be determined as the designer desires. In the present embodiment, it is assumed that, as the connection specifications of the slot-side connector 18, specifications that do not conform to either the PCI (Peripheral Component Interconnect) or the PCIe (Peripheral Component Interconnect-express) standard but are uniquely designed by the designer is adopted.

The adapter 10 of the present embodiment is connected to the control board 16 via the slot-side connector 18 as described above. The adapter 10 is connected to the control board 16 via the slot-side connector 18 by being inserted into the slot 14. An insertion board 20 can be attached and connected to the adapter 10. By inserting the adapter 10 with the insertion board 20 attached thereto into the slot 14, the control board 16 and the insertion board 20 can be connected to each other via the adapter 10 and the slot-side connector 18.

The insertion board 20 according to the present embodiment may include a PCI board 20a whose shape and connection specifications are designed based on the PCI standard, and a PCIe board 20b whose shape and connection specifications are designed based on the PCIe standard. To the adapter 10 of the present embodiment, a PCI board 20a and a PCIe board 20b can be selectively attached. The configuration of the adapter 10 will be illustrated in detail. In the following, when there is no need to distinguish between the PCI board 20a and the PCIe board 20b, they are referred to simply as "insertion board 20".

As shown in FIG. 1, the adapter 10 includes a base plate 24 on which the insertion board 20 is placed. On the base plate 24, one of the PCI board 20a and the PCIe board 20b can be mounted selectively. The insertion board 20 mounted on the base plate 24 is attached to the base plate 24 by a bracket 26 and an attachment structure 28 provided in the base plate 24. The insertion board 20 placed on the base plate 24 is connected to a relay board 30 provided on the adapter 10. The relay board 30 is held by a holding structure 32 provided on the base plate 24.

The bracket 26 is a fixing member for fixing the insertion board 20 to the base plate 24, and is joined to the right side surface of the insertion board 20 in this embodiment. The bracket 26 is formed with one or more insertion holes 36 through which fastening members 34 are inserted. The fastening member 34 is, for example, a screw or a bolt.

Figure 2:
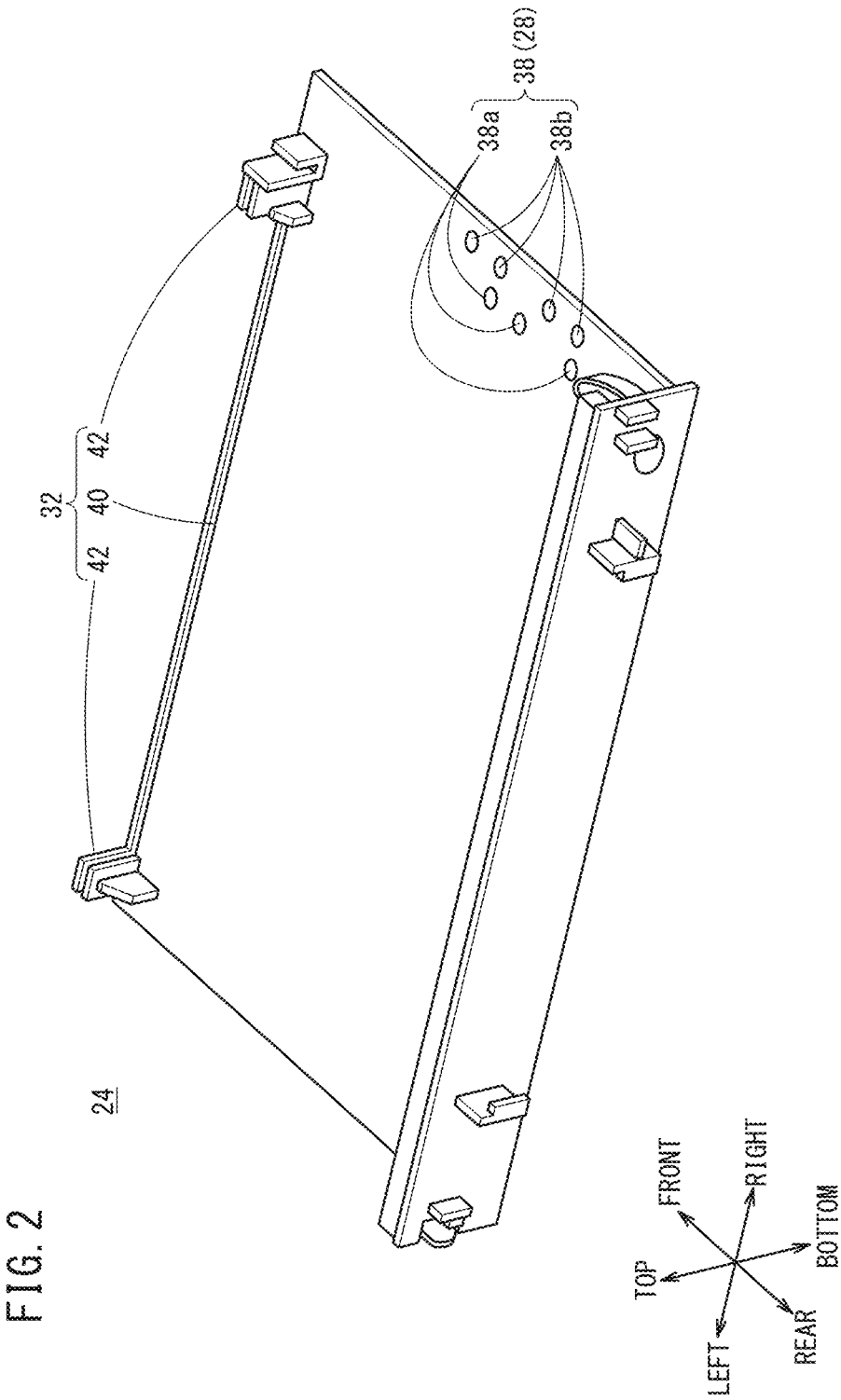
FIG. 2 is a perspective view of a base plate of the embodiment.

FIG. 2 is a perspective view of the base plate 24 of the embodiment.

The attachment structure 28 of the base plate 24 has one or more insertion holes 38 through which the fastening members 34 are inserted. In this embodiment, the bracket 26 is fixed to the base plate 24 by aligning the insertion holes 36 of the bracket 26 with the insertion holes 38 of the base plate 24 and inserting the fastening members 34 into the aligned holes. As described above, the bracket 26 and the insertion board 20 are joined to each other. Therefore, the insertion board 20 is fixed to the base plate 24 by fixing the bracket 26 to the base plate 24 with the fastening members 34.

There are two types of brackets 26, i.e., a PCI bracket 26a for fixing the PCI board 20a and a PCIe bracket 26b for fixing the PCIe board 20b. Therefore, those skilled in the art can set the PCI bracket 26a on the base plate 24 when a PCI board 20a is mounted on the base plate 24. On the other hand, those skilled in the art can set the PCIe bracket 26b on the base plate 24 when a PCIe board 20b is mounted on the base plate 24.

The base plate 24 is provided with insertion holes 38a corresponding to the insertion holes 36 of the PCI bracket 26a and insertion holes 38b corresponding to the insertion holes 36 of the PCIe bracket 26b. Therefore, those skilled in the art can insert the fastening members 34 into the insertion holes 38a when the PCI bracket 26a is attached on the base plate 24. Further, those skilled in the art can insert the fastening members 34 into the insertion holes 38b when the PCIe bracket 26b is attached on the base plate 24. Thus, in the present embodiment, it is possible to selectively attach the PCI bracket 26a or the PCIe bracket 26b to the base plate 24.

The holding structure 32 of the base plate 24 includes a groove 40 into which the relay board 30 is fitted and a retainer 42 that holds the relay board 30 fitted in the groove 40. In the present embodiment, the retainer 42 has a claw-shaped engaging part 44. The engaging part 44 is configured to engage with a notch (or indentation) 46 formed in the relay board 30, as will be described later (see also the enlarged view of FIG. 1). As shown in FIG. 2, in this embodiment, two retainers 42 are provided on the base plate 24 so as to be spaced at an interval in the left-right direction.

Figure 3A:
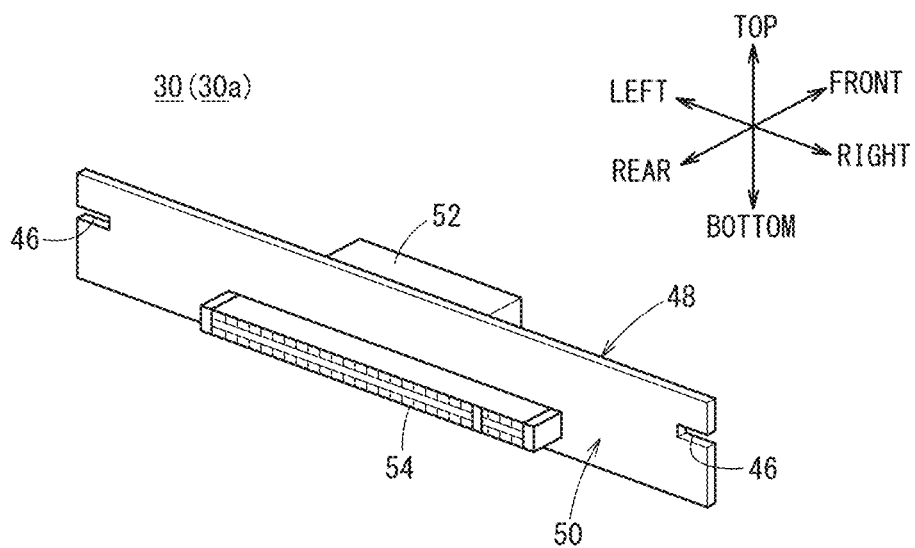
FIG. 3A is a perspective view of a PCI relay board according to the embodiment.
Figure 3B:
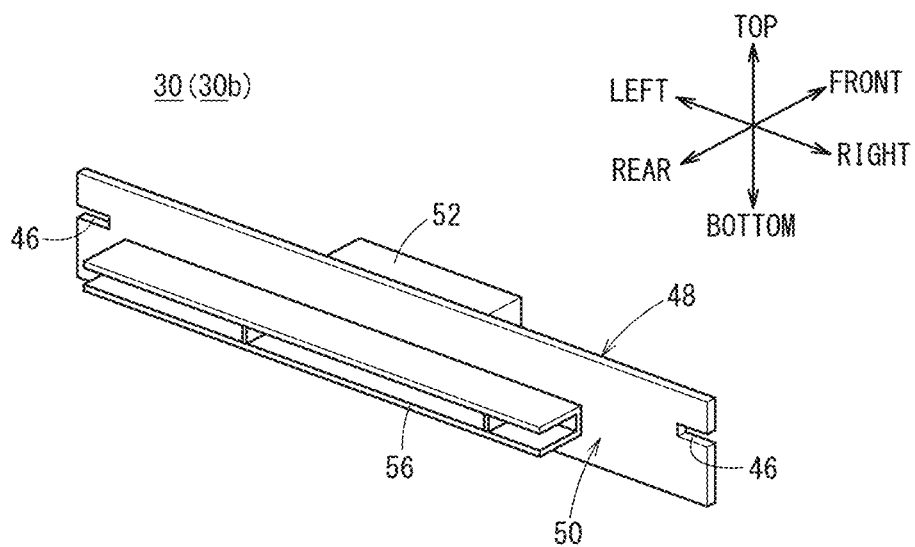
FIG. 3B is a perspective view of a PCIe relay board according to the embodiment.

FIG. 3A is a perspective view of a PCI relay board 30a of the embodiment. FIG. 3B is a perspective view of a PCIe relay board 30b according to the embodiment.

There are two types of relay board 30, i.e., a PCI relay board 30a for connecting the PCI board 20a with the control board 16, and a PCIe relay board 30b for connecting the PCIe board 20b with the control board 16. Accordingly, those skilled in the art can set the PCI relay board 30a on the base plate 24 when the PCI board 20a is placed on the base plate 24. When the PCIe board 20b is placed on the base plate 24, those skilled in the art can set the PCIe relay board 30b on the base plate 24.

In this embodiment, it is assumed that the PCI relay board 30a and the PCIe relay board 30b have the same size (length, width and thickness). In the following description, when it is not necessary to distinguish between the PCI relay board 30a and the PCIe relay board 30b, the two are simply referred to as "relay board 30".

The notch 46 that engages with the engaging part 44 of the base plate 24 has the same configuration in both the PCI relay board 30a and the PCIe relay board 30b. The notch 46 is formed on each of the left and right ends of the relay board 30. The notches 46 provided at the left and right ends correspond respectively to the two retainers 42 on the base plate 24. Thus, in the present embodiment, the base plate 24 can selectively hold the PCI relay board 30a or the PCIe relay board 30b. The positions where the notches 46 are formed are not limited to the both ends of the relay board 30 in the left and right direction. For example, only one notch may be provided on one of the left and right ends. In that case, only one retainer 42 may be provided on the base plate 24 correspondingly to the single notch 46.

The relay board 30 has a first surface 48 and a second surface 50 that intersect the direction of insertion of the adaptor. The first surface 48 opposes the control board 16 (facing forward) when the adapter 10 is inserted into the slot 14. The second surface 50 opposes the insertion board 20 (facing rearward) when the adapter 10 is inserted into the slot 14. The relay board 30 has, on the first surface 48, a first connector 52 to be connected to the control board 16, as a configuration common to the PCI relay board 30a and the PCIe relay board 30b. That is, the first connector 52 is a connector that can be connected to the slot-side connector 18 provided in the slot 14.

The PCI relay board 30a has a second connector 54 that can be connected to the PCI board 20a, on the second surface 50. That is, the second connector 54 is one that can be connected to the board-side connector 22 provided on the PCI board 20a. The first connector 52 and the second connector 54 of the PCI relay board 30a are connected to each other via a predetermined signal conversion structure formed inside the PCI relay board 30a. Thus, the PCI board 20a designed according to the PCI standard can be connected to the control board 16 via the slot-side connector 18.

The PCIe relay board 30b has a third connector 56 that can be connected to the PCIe board 20b, on the second surface 50. That is, the third connector 56 is one that can be connected to the board-side connector 22 provided on the PCIe board 20b. The second connector 54 is not provided on the second surface 50 of the PCIe relay board 30b. The first connector 52 and the third connector 56 of the PCIe relay board 30b are connected to each other via a predetermined signal conversion structure formed inside the PCIe relay board 30b. Thus, the PCIe board 20b designed according to the PCIe standard can be connected to the control board 16 via the slot-side connector 18.

The adapter 10 described as above can be easily assembled by providing the PCI relay board 30a and the PCI bracket 26a on the base plate 24 when the PCI board 20a needs to be connected to the control board 16. Then, the PCI board 20a is mounted on the assembled adapter 10 and the adapter 10 is inserted into the slot 14, whereby the PCI board 20a and the control board 16 can be connected to each other.

Further, the adapter 10 facilitates replacement of the provided PCI relay board 30a, with the PCIe relay board 30b and replacement of the provided PCI bracket 26a, with the PCIe bracket 26*b*. By mounting the PCIe board 20*b* to the adapter 10 equipped with the PCIe relay board 30*b* and the PCIe bracket 26*b* and inserting the adapter 10 into the slot 14, it is possible to connect the PCIe board 20*b* to the control board 16. Needless to say, in the adapter 10, it is also easy to replace the provided PCIe relay board 30*b* with the PCI relay board 30*a* and replace the provided PCIe bracket 26*b* with the PCI bracket 26*a*.

In this way, in the adapter 10 of the present embodiment, the attachment structure 28 and the holding structure 32 provided in the base plate 24 make it easy to change the bracket 26 and the relay board 30 as appropriate. Therefore, it is easy to selectively attach the PCI board 20*a* and the PCIe board 20*b* to the adapter 10 according to the present embodiment.

The present embodiment has been explained based on the premise of the slot-side connector 18 having original specifications designed by those skilled in the art. However, the slot-side connector 18 that can be used for the adapter 10 is not limited to such original specifications of those skilled in the art. For example, if the slot-side connector 18 is compliant with the PCIe standard while the board-side connector 22 is compliant with the PCI standard, a PCI relay board 30*a* having the first connector 52 compliant with the PCIe standard may be set on the base plate 24.

Also, for the PCIe standard, there are two kinds of board-side connectors 22; one is straight type and the other is right-angle type. The straight type is also used for the PCI standard board-side connector 22, and the straight type board-side connector 22 is oriented in the direction of insertion. In contrast to the straight type, the right-angle type board-side connector 22 is oriented in a direction intersecting with the direction of insertion. For this reason, one PCIe relay board 30*b* that has a third connector 56 supporting the straight board-side connector 22 and another PCIe relay board 30*b* that has a third connector 56' supporting the right-angle board-side connector 22 may and should be prepared as appropriate.

[Modifications]

Though the above embodiment has been described as an example of the present invention, it goes without saying that various modifications and improvements can be added to the above embodiment. It is also apparent from the scope of the claims that modes added with such modifications and improvements should be incorporated in the technical scope of the invention.

(Modification 1)

In the description of the above embodiment, the insertion holes 38*a* corresponding to the insertion holes 36 of the PCI bracket 26*a* and the insertion holes 38*b* corresponding to the insertion holes 36 of the PCIe bracket 26*b* are formed in the base plate 24. However, at least one of the insertion holes 38 may be formed so as to be used in common, i.e., the fastening member 34 is inserted into the one insertion hole in both cases where the PCI bracket 26*a* is attached to the base plate 24 and where the PCIe bracket 26*b* is attached to the base plate 24. That is, at least one of the one or more insertion holes 38 may be formed at a position corresponding to both one of the insertion holes 36 in the PCI bracket 26*a* and one of the insertion holes 36 in the PCIe bracket 26*b*. This makes it possible to reduce the number of insertion holes 38 formed in the base plate 24.

(Modification 2)

In the description of the above embodiment, the relay board 30 is provided with the notch 46 configured to be engaged with the engaging part 44 of the base plate 24. However, for example, an engagement hole 46' may be formed in the relay board 30 instead of the notch 46. Engagement between the engaging part 44 and the engagement hole 46' also makes it possible to favorably hold the relay board 30 on the base plate 24 similarly to the above embodiment.

(Modification 3)

In the description of the above embodiment, one notch 46 may be provided at each of the left and right ends of the relay board 30. In Modification 2, the engagement hole 46' may be provided instead of the notch 46. In relation to the above, for example, the notch 46 may be formed at one of the left and right ends of the relay board 30 while the engagement hole 46' described in Modification 2 may be formed at the other end. This enhances design flexibility for the retainer 42 and the relay board 30.

(Modification 4)

In the description of the above embodiment, one or two retainers 42 may be provided on the base plate 24 correspondingly to one or two notches 46 of the relay board 30. However, three or more retainers 42 and three or more notches 46 may be provided correspondingly. Further, in relation to Modifications 2 and 3, for example, an engagement hole 46' may be formed in the relay board 30, instead of at least one of the three or more notches 46 provided in the relay board 30. This enhances design flexibility for the retainer 42 and the relay board 30.

(Modification 5)

In the description of the above embodiment, the holding structure 32 of the base plate 24 has the groove 40 into which the relay board 30 is fitted. However, the holding structure 32 may have a pair of banks that support the relay board 30, on at least part of the edge of the groove 40. In this case, the relay board 30 can be held more stably.

(Modification 6)

The above embodiment and Modifications may be combined as appropriate as long as no contradiction occurs.

[Invention Obtained from the Embodiment]

The invention that can be grasped from the above embodiment and Modifications will be described below.

The adapter (10) configured to be inserted into a slot (14) of an electronic device (12) and also configured to connect each of a PCI (Peripheral Component Interconnect) board (20*a*) and a PCIe (Peripheral Component Interconnect-express) board (20*b*) to a control board (16) that is installed on a side of the slot toward which the adaptor (10) is inserted, includes a base plate (24). The base plate (24) includes: a holding structure (32) configured to selectively hold a PCI relay board (30*a*) for connecting the PCI board (20*a*) to the control board (16) and a PCIe relay board (30*b*) for connecting the PCIe board (20*b*) to the control board (16); and an attachment structure (28) configured to selectively attach a PCI bracket (26*a*) for fixing the PCI board (20*a*) to the base plate (24) and a PCIe bracket (26*b*) for fixing the PCIe board (20*b*) to the base plate (24).

This provides an adapter (10) that facilitates selective attachment of the PCI board (20*a*) and the PCIe board (20*b*).

The holding structure (32) may include: a groove (40) into which each of the PCI relay board (30*a*) and the PCIe relay board (30*b*) is fitted; and a retainer (42) configured to hold each of the PCI relay board (30*a*) and the PCIe relay board (30*b*) fitted into the groove (40). This configuration makes it possible to selectively hold the PCI relay board (30*a*) and the PCIe relay board (30*b*).

The retainer (42) may include an engaging part (44) configured to engage with a notch (46) or an engagement hole (46') formed in each of the PCI relay board (30*a*) and the PCIe relay board (30*b*). This configuration in cooperation with the groove (40) makes it possible to stably hold the relay board (30) on the base plate (24).

The attachment structure (28) may include one or more insertion holes (38), a fastening member (34) for attaching the PCI bracket (26*a*) or the PCIe bracket (26*b*) to the base plate (24) being inserted into the base plate (24) through each of the insertion holes. This enables selective attachment of the PCI bracket (26*a*) and the PCIe bracket (26*b*).

The fastening member (34) may be inserted into at least one of the one or more insertion holes (38) in both cases where the PCI bracket (26*a*) is attached to the base plate (24) and where the PCIe bracket (26*b*) is attached to the base plate (24). With this configuration, the number of insertion holes (38) to be formed in the base plate (24) can be reduced.

The PCI relay board (30*a*) may include a first connector (52) configured to be connectable to the control board (16) and a second connector (54) configured to be connectable to the PCI board (20*a*). The PCIe relay board (30*b*) may include the first connector (52) and a third connector (56, 56') configured to be connectable to the PCIe board (20*b*). As a result, the PCI board (20*a*) and the control board (16) can be connected via the PCI relay board (30*a*). This also enables the PCIe board (20*b*) and the control board (16) to be connected via the PCIe relay board (30*b*).

The base plate (24) may be provided with the PCI relay board (30*a*) and the PCI bracket (26*a*). With this configuration, when the adapter (10) is inserted into the slot (14) of the electronic device (12), the PCI board (20*a*) and the control board (16) can be connected.

The base plate (24) may be provided with the PCIe relay board (30*b*) and the PCIe bracket (26*b*). With this configuration, when the adapter (10) is inserted into the slot (14) of the electronic device (12), the PCIe board (20*b*) and the control board (16) can be connected.

What is claimed is:

1. An adapter configured to be inserted into a slot of an electronic device and also configured to connect each of a Peripheral Component Interconnect (PCI) board and a Peripheral Component Interconnect-express (PCIe) board to a control board that is installed on a side of the slot toward which the adaptor is inserted, the adapter comprising a base plate,
   wherein the base plate comprises:
   a holding structure configured to selectively hold a Peripheral Component Interconnect (PCI) relay board configured to connect the PCI board to the control board and a Peripheral Component Interconnect-express (PCIe) relay board configured to connect the PCIe board to the control board; and
   an attachment structure configured to selectively attach a Peripheral Component Interconnect (PCI) bracket configured to fix the PCI board to the base plate and a Peripheral Component Interconnect-express (PCIe) bracket configured to fix the PCIe board to the base plate,
   wherein the attachment structure includes a plurality of insertion holes,
   the plurality of insertion holes includes
   one or more first insertion holes that allows a fastening member to be inserted into the base plate wherein the fastening member attaches the PCI bracket to the base plate, and
   one or more second insertion holes that differs from the one or more first insertion holes and allows a fastening member to be inserted into the base plate wherein the fastening member attaches the PCIe bracket to the base plate.

2. The adapter according to claim 1, wherein the holding structure includes:
   a groove into which each of the PCI relay board and the PCIe relay board is fitted; and
   a retainer configured to hold each of the PCI relay board and the PCIe relay board fitted into the groove.

3. The adapter according to claim 2, wherein the retainer includes an engaging part configured to engage with a notch or an engagement hole formed in each of the PCI relay board and the PCIe relay board.

4. The adapter according to claim 1, wherein the attachment structure includes one or more insertion holes, and a fastening member for attaching the PCI bracket or the PCIe bracket to the base plate is inserted into the base plate through each of the insertion holes.

5. The adapter according to claim 4, wherein the fastening member is inserted into at least one of the one or more insertion holes in both cases where the PCI bracket is attached to the base plate and where the PCIe bracket is attached to the base plate.

6. The adapter according to claim 1, wherein:
   the PCI relay board includes:
   a first connector configured to be connectable to the control board; and
   a second connector configured to be connectable to the PCI board; and
   the PCIe relay board includes:
   the first connector; and
   a third connector configured to be connectable to the PCIe board.

7. The adapter according to claim 1, wherein the base plate is provided with the PCI relay board and the PCI bracket.

8. The adapter according to claim 1, wherein the base plate is provided with the PCIe relay board and the PCIe bracket.

* * * * *